(12) United States Patent
Tsai et al.

(10) Patent No.: US 11,929,747 B2
(45) Date of Patent: Mar. 12, 2024

(54) LEVEL SHIFTER (71) Applicant: REALTEK SEMICONDUCTOR CORPORATION, Hsinchu (TW)

(72) Inventors: Chien-Hui Tsai, Hsinchu (TW); Hung-Chen Chu, Hsinchu (TW); Yung-Tai Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/727,909

(22) Filed: Apr. 25, 2022

(65) Prior Publication Data

US 2023/0006660 A1    Jan. 5, 2023

(30) Foreign Application Priority Data

Jul. 2, 2021   (TW) ................................ 110124347

(51) Int. Cl.
*H03K 19/0185* (2006.01)
*H03K 3/037* (2006.01)

(52) U.S. Cl.
CPC ... *H03K 3/0375* (2013.01); *H03K 19/018528* (2013.01)

(58) Field of Classification Search
CPC ............. H03K 19/0185–18528; H03K 3/0375
See application file for complete search history.

(56) References Cited

U.S. PATENT DOCUMENTS

| 4,978,870 | A | 12/1990 | Chen et al. |
| 6,099,100 | A * | 8/2000 | Lee ..................... H03K 17/102 326/83 |
| 7,683,668 | B1 | 3/2010 | Thakur et al. |
| 8,643,425 | B2 * | 2/2014 | Chaudhry ........ H03K 3/356182 327/306 |
| 10,965,116 | B2 | 3/2021 | Yu et al. |
| 11,152,941 | B2 * | 10/2021 | Shubin ................... H03K 19/00 |

(Continued)

OTHER PUBLICATIONS

B. Serneels, M. Steyaert and W. Dehaene, "A High speed, Low Voltage to High Voltage Level Shifter in Standard 1.2V 0.13μm CMOS," 2006 13th IEEE International Conference on Electronics, Circuits and Systems, Nice, France, 2006, pp. 668-671, (Year: 2006).*

(Continued)

*Primary Examiner* — Patrick O Neill
(74) *Attorney, Agent, or Firm* — WPAT, P.C.

(57) ABSTRACT

A level shifter can achieve a level shift by a wide margin. The level shifter includes a latch circuit, a clamping circuit, a protection circuit, and an input circuit. The latch circuit is coupled between a high-voltage terminal and a pair of output terminals for outputting a pair of output signals. The clamping circuit is coupled between a medium-voltage terminal and the pair of output terminals and limits the minimum voltage of the pair of output signals to the medium voltage. The protection circuit is set between the latch circuit and the input circuit, and prevents an excessive voltage drop between the input circuit and the pair of output terminals. The input circuit includes an input transistor pair coupled between the protection circuit and a low-voltage terminal having a low voltage. The input transistor pair receives a pair of input signals and operates accordingly.

6 Claims, 9 Drawing Sheets

(56) References Cited

U.S. PATENT DOCUMENTS

| | | | |
|---|---|---|---|
| 2005/0134355 A1* | 6/2005 | Maede | H03K 17/102 327/333 |
| 2008/0007314 A1 | 1/2008 | Ricard et al. | |
| 2012/0001672 A1 | 1/2012 | Barrow | |
| 2017/0047927 A1 | 2/2017 | Liu et al. | |

OTHER PUBLICATIONS

OA letter of a counterpart TW application (appl. No. 110124347) mailed on Nov. 9, 2021. Summary of the OA letter: (1)Claims 1-5 are rejected as being unpatentable over the cited reference 1 (US 2017/0047927 A1) in view of the cited reference 2 (US 2012/0001672 A1). P.S. Correspondence between the claims of the TW counterpart application and the claims of the present US application: (1) Claims 1-5 of the TW counterpart application are corresponding to the claims 1-4 and 6 of the present US application respectively.

* cited by examiner

LEVEL SHIFTER

BACKGROUND OF THE INVENTION

1. Field of the Invention

The present disclosure relates to a level shifter, especially to a level shifter capable of achieving a level shift by a wide margin.

2. Description of Related Art

Figure 1:
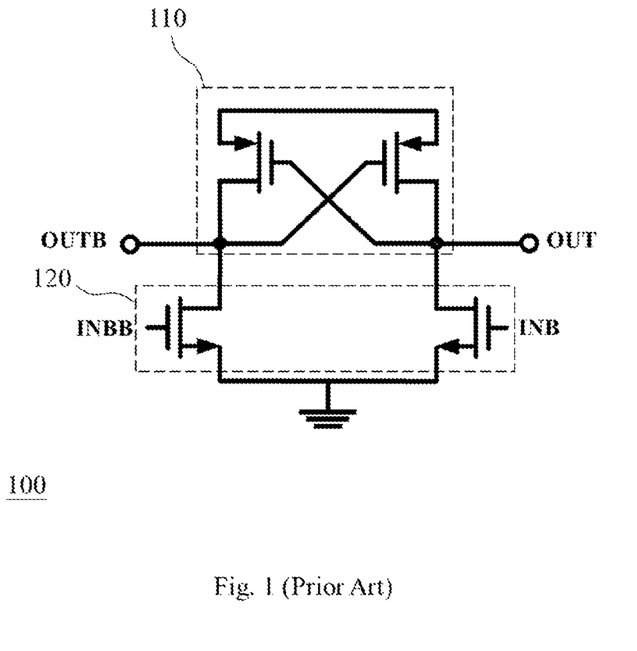
FIG. 1 shows a conventional level shifter.

FIG. 1 shows a conventional level shifter 100 including a latch circuit 110 and an input transistor pair 120. The input transistor pair 120 is coupled between a pair of input signal terminals and a ground terminal and configured to be selectively turned on according to the signals at the pair of input signal terminals, i.e. a pair of input signals INB, INBB. The pair of input signals INB, INBB are generated according to signals of a core power domain and thus vary within a narrow voltage range (e.g., 0.9~0V); in addition, the input transistor pair 120 for receiving the pair of input signals INB, INBB could be core devices having lower withstand voltages. The latch circuit 110 is coupled between a medium-voltage terminal and a pair of signal output terminals and configured to output a pair of output signals OUT, OUTB at the pair of signal output terminals according to the conduction status of the input transistor pair 120. The pair of output signals OUT, OUTB are outputted to a circuit in another power domain and thus vary within a wide voltage range (e.g., 1.8V~0V); in addition, the transistors of the latch circuit 110 for receiving the pair of output signals OUT, OUTB can be I/O devices having higher withstand voltages. Although the transistors of the latch circuit 110 may have higher withstand voltages, if the circuit in the another power domain expects the voltage upper limit of the pair of output signals OUT, OUTB to be higher (e.g., 3.3V) and the withstand voltages of the transistors (e.g., FinFETs manufactured with an advanced process) of the latch circuit 110 is not high enough, the transistors of the latch circuit 110 cannot withstand this higher voltage upper limit under the circuit configuration of FIG. 1.

SUMMARY OF THE INVENTION

An object of the present disclosure is to provide a level shifter without the problems of the prior art.

An embodiment of the level shifter of the present disclosure includes a latch circuit, a clamping circuit, a protection circuit, and an input circuit. The latch circuit is coupled between a high-voltage terminal and a pair of signal output terminals. The voltage at the high-voltage terminal is a high voltage. The pair of signal output terminals includes a first output terminal and a second output terminal that are used for outputting a first output signal and a second output signal respectively. The voltage of each of the first output signal and the second output signal falls within an output voltage range between the high voltage and a medium voltage. The clamping circuit is coupled between the pair of signal output terminals and a medium-voltage terminal, and configured to selectively couple the pair of signal output terminals with the medium-voltage terminal according to the first output signal and the second output signal so as to limit a lower limit of the output voltage range to the voltage at the medium-voltage terminal, that is to say the medium voltage. The protection circuit includes a first protection transistor pair and a second protection transistor pair and configured to create a voltage drop. The first protection transistor pair is set between the latch circuit and the second protection transistor pair, and the second protection transistor pair is set between the first protection transistor pair and the input circuit. The input circuit includes an input transistor pair. The input transistor pair is coupled between the second protection transistor pair and a low-voltage terminal and configured to be selectively turned on according to a pair of input signals. The voltage at the low-voltage terminal is a low voltage. The pair of input signals includes a first input signal and a second input signal. The voltage of each of the first input signal and the second input signal falls within an input voltage range, and the input voltage range is between the medium voltage and the low voltage.

Another embodiment of the level shifter includes a latch circuit, a protection circuit, and an input circuit. The latch circuit is coupled between a high-voltage terminal and the protection circuit. The voltage at the high-voltage terminal is a high voltage in an operating mode. The protection circuit includes a first protection transistor pair and a second protection transistor pair and configured to create a voltage drop according to the voltage at a medium-voltage terminal. The first protection transistor pair is set between the latch circuit and a pair of signal output terminals, the second protection transistor pair is set between the pair of signal output terminals and the input circuit, and the pair of signal output terminals includes a first output terminal and a second output terminal In the operating mode, the voltage at the medium-voltage terminal is a medium voltage, the first output terminal and the second output terminal are used for outputting a first output signal and a second output signal respectively, the voltage of each of the first output signal and the second output signal falls within an output voltage range, the output voltage range is between the high voltage and a low voltage, and the low voltage is higher than a ground voltage. The input circuit includes an input transistor pair. The input transistor pair is coupled between the second protection transistor pair and a low-voltage terminal and configured to be selectively turned on according to a pair of input signals. Furthermore, in the operating mode, a voltage at the low-voltage terminal is the low voltage, the pair of input signals includes a first input signal and a second input signal, the voltage of each of the first input signal and the second input signal falls within an input voltage range, and the input voltage range is between the medium voltage and the low voltage.

A further embodiment of the level shifter of the present disclosure includes a latch circuit, a protection circuit, and an input circuit. The latch circuit is coupled between a high-voltage terminal and the protection circuit, wherein the voltage at the high-voltage terminal is a high voltage in an operating mode. The protection circuit includes a first protection transistor pair and a second protection transistor pair and configured to create a voltage drop according to the voltage at a medium-voltage terminal. The first protection transistor pair is set between the latch circuit and a pair of signal output terminals, the second protection transistor pair is set between the pair of signal output terminals and the input circuit, and the pair of signal output terminals includes a first output terminal and a second output terminal In the operating mode, the voltage at the medium-voltage terminal is a medium voltage, the first output terminal and the second output terminal are used for outputting a first output signal and a second output signal respectively, the voltage of each of the first output signal and the second output signal falls within an output voltage range, and the output voltage range is between the high voltage and a ground voltage. The input circuit includes an input transistor pair coupled between the second protection transistor pair and a low-voltage terminal and configured to be selectively turned on according to a pair of input signals. Furthermore, in the operating mode, the voltage at the low-voltage terminal is the ground voltage, the pair of input signals includes a first input signal and a second input signal, the voltage of each of the first input signal and the second input signal falls within an input voltage range, and the input voltage range is between the medium voltage and the ground voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a level shifter capable of achieving a level shift by a wide margin. The margin of the level shift can be higher than the withstand voltage (e.g., 1.8V) of at least one transistor of the level shifter; for example, the withstand voltage is lower than the upper limit of an output voltage range of the level shifter.

Figure 2:
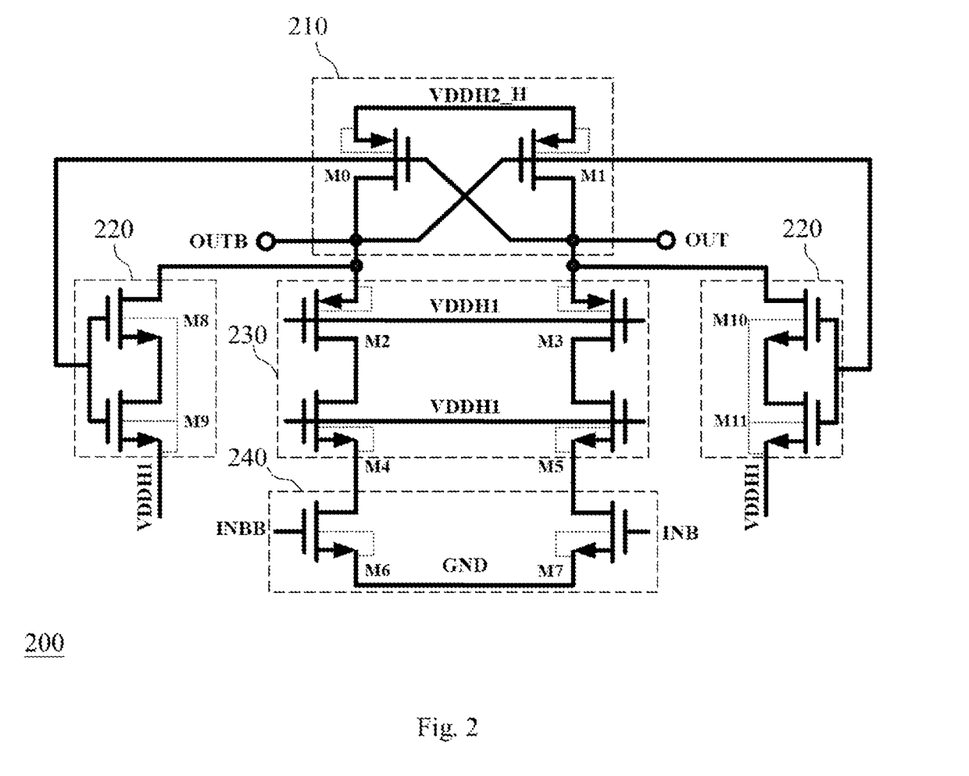
FIG. 2 shows an embodiment of the level shifter of the present disclosure.

FIG. 2 shows an embodiment of the level shifter of the present disclosure. The level shifter 200 of FIG. 2 is configured to convert a medium voltage VDDH1 (e.g., 1.8V) into a high voltage VDDH2_H (e.g., 3.3V). The level shifter 200 includes a latch circuit 210, a clamping circuit 220, a protection circuit 230, and an input circuit 240. These circuits are described in the following paragraphs.

In regard to the embodiment of FIG. 2, the latch circuit 210 is coupled between a high-voltage terminal and a pair of signal output terminals and includes a transistor pair (i.e., "M0, M1" in FIG. 2). The voltage at the high-voltage terminal is the aforementioned high voltage VDDH2_H. The pair of signal output terminals includes a first output terminal and a second output terminal that are used for outputting a first output signal OUT and a second output signal OUTB respectively, wherein the two output signals are complementary. The voltage of each of the first output signal OUT and the second output signal OUTB falls within an output voltage range between the high voltage VDDH2_H and the medium voltage VDDH1. It should be noted that the bodies of the transistor pair (i.e., M0, M1) can be coupled to the high-voltage terminal as illustrated with the dotted lines in FIG. 2 in order to prevent a leakage current or an overvoltage, but the present invention is not limited thereto.

In regard to the embodiment of FIG. 2, the clamping circuit 220 is coupled between the pair of signal output terminals and a medium-voltage terminal, and configured to selectively couple the pair of signal output terminals with the medium-voltage terminal according to the first output signal OUT and the second output signal OUTB so as to limit the lower limit of the output voltage range to the voltage at the medium-voltage terminal, that is to say the medium voltage VDDH1. In this embodiment, the clamping circuit 220 includes a first set of transistors (i.e., "M8, M9" in FIG. 2) and a second set of transistors (i.e., "M10, M11" in FIG. 2), and each set of transistors can include one or more transistors according to the demand for implementation. The first set of transistors is coupled between the second output terminal and the medium-voltage terminal, and configured to be turned on or turned off according to the first output signal OUT. The second set of transistors is coupled between the first output terminal and the medium-voltage terminal, and configured to be turned on or turned off according to the second output signal OUTB. Other means for limiting the lower limit of the output voltage range can be applied in the implementation of the clamping circuit 220. It should be noted that the bodies of the first set of transistors (i.e., M8, M9) and the bodies of the second set of transistors (M10, M11) can be coupled to the medium-voltage terminal as illustrated with the dotted lines in FIG. 2 to prevent a leakage current or an overvoltage, but the present invention is not limited thereto.

In regard to the embodiment of FIG. 2, the protection circuit 230 includes a first protection transistor pair (i.e., "M2, M3" in FIG. 2) and a second protection transistor pair (i.e., "M4, M5" in FIG. 2) and is configured to create a voltage drop according to the medium voltage VDDH1 so as to prevent an excessively high voltage difference between the pair of signal output terminals and the input circuit 240. The first protection transistor pair (i.e., M2, M3) is set between the latch circuit 210 and the second protection transistor pair (i.e., M4, M5), and the second protection transistor pair is set between the first protection transistor pair and the input circuit 240. In this embodiment, the first protection transistor pair (i.e., M2, M3) is a PMOS transistor pair and the second protection transistor pair (i.e., M4, M5) is an NMOS transistor pair, but the present invention is not limited thereto. It should be noted that the body and source of each transistor in the first and second protection transistor pairs can be coupled together as illustrated with the dotted lines in FIG. 2 to prevent a leakage current or an overvoltage, but the present invention is not limited thereto.

In regard to the embodiment of FIG. 2, the input circuit 240 includes an input transistor pair (i.e., "M6, M7" in FIG. 2). The input transistor pair is coupled between the second protection transistor pair (i.e., M4, M5) and a low-voltage terminal and configured to operate according to a pair of input signals INB, INBB. The voltage at the low-voltage terminal is a low voltage GND (e.g., 0V). The pair of input signals includes a first input signal INB and a second input signal INBB that are complementary. The voltage of each of the first input signal INB and the second input signal INBB falls within an input voltage range, and the input voltage range is between the medium voltage VDDH1 and the low voltage GND. It should be noted that the body and source of each transistor in the input transistor pair can be coupled together as illustrated with the dotted lines in FIG. 2 to prevent a leakage current or an overvoltage, but the present invention is not limited thereto.

Figure 3:
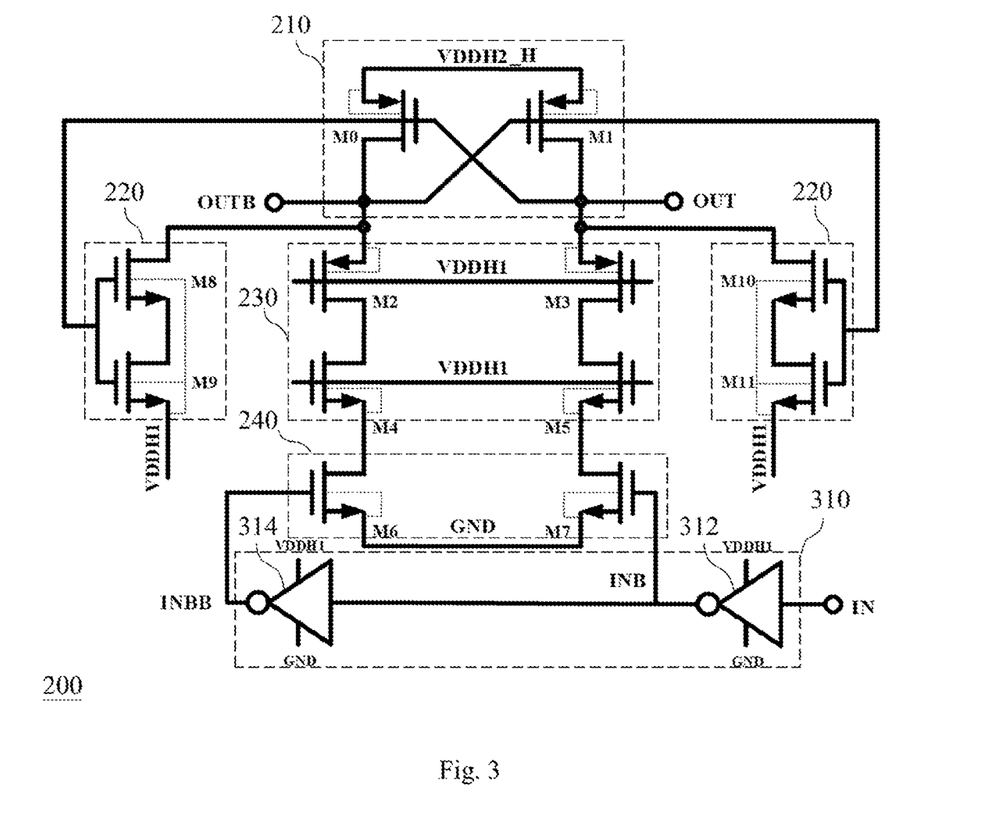
FIG. 3 shows another embodiment of the level shifter of the present disclosure.

FIG. 3 shows another embodiment of the level shifter of the present disclosure. In comparison with the embodiment of FIG. 2, the input circuit 240 of the embodiment of FIG. 3 cooperates with a buffer circuit 310. The buffer circuit 310 is configured to generate the pair of input signals INB, INBB according to a reception signal IN. In the embodiment of FIG. 3, the buffer circuit 310 includes a first inverter 312 and a second inverter 314. The first inverter 312 is configured to generate a first inverted signal as the first input signal INB according to the reception signal IN. The second inverter 314 is configured to generate a second inverted signal as the second input signal INBB according to the first inverted signal INB. Each of the first inverter 312 and the second inverter 314 operates in an operating voltage range between the medium voltage VDDH1 and the low voltage GND. It should be noted that the first inverter 312 and the second inverter 314 can be replaced by one or more circuits having the function of the buffer circuit 310.

Figure 4:
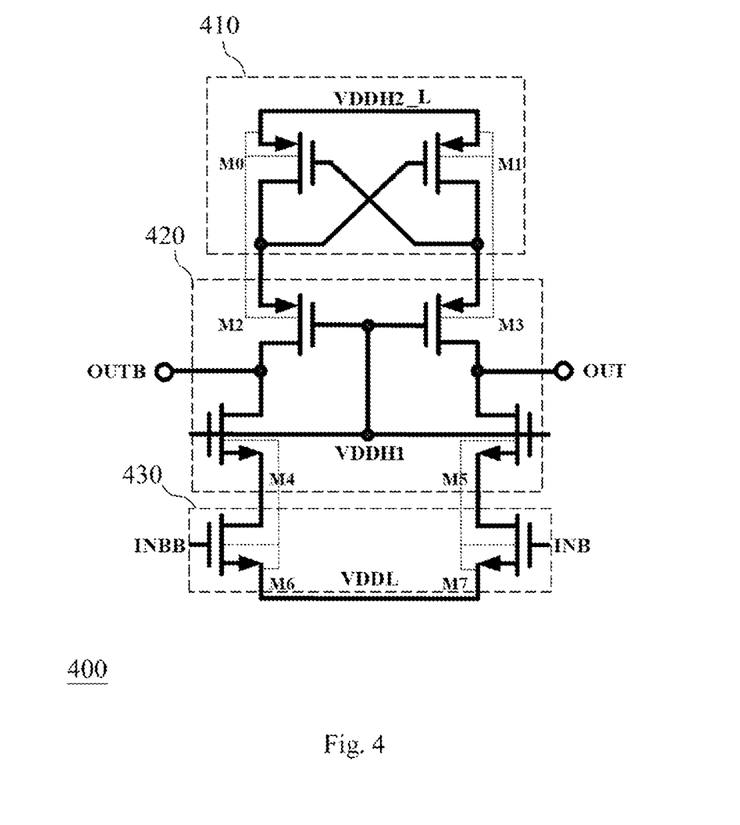
FIG. 4 shows yet another embodiment of the level shifter of the present disclosure.

FIG. 4 shows another embodiment of the level shifter of the present disclosure. The level shifter 400 of FIG. 4 is configured to convert a high voltage VDDH2_L (e.g., 3V) into a low voltage VDDL (e.g., 0.9V), wherein the low voltage VDDL is greater than a ground voltage GND. The level shifter 400 includes a latch circuit 410, a protection circuit 420, and an input circuit 430. These circuits are described in the following paragraphs.

In regard to the embodiment of FIG. 4, the latch circuit 410 is coupled between a high-voltage terminal and the protection circuit 420 and includes a transistor pair (i.e., "M0, M1" in FIG. 4). The voltage at the high-voltage terminal is the high voltage VDDH2_L in an operating mode. It should be noted that the bodies of the transistor pair can be coupled to the high-voltage terminal as illustrated with the dotted lines in FIG. 4 to prevent a leakage current or an overvoltage, but the present invention is not limited thereto.

In regard to the embodiment of FIG. 4, the protection circuit 420 includes a first protection transistor pair (i.e., "M2, M3" in FIG. 4) and a second protection transistor pair (i.e., "M4, M5" in FIG. 4) and is configured to operate according to the voltage at a medium-voltage terminal. The first protection transistor pair is set between the latch circuit 410 and a pair of signal output terminals, and the second protection transistor pair is set between the pair of signal output terminals and the input circuit 430. The pair of signal output terminals includes a first output terminal and a second output terminal. In the operating mode, the voltage at the medium-voltage terminal is a medium voltage VDDH1 (e.g., 1.8V); the first output terminal and the second output terminal are used for outputting a first output signal OUT and a second output signal OUTB respectively; the voltage of each of the first output signal OUT and the second output signal OUTB falls within an output voltage range; the output voltage range is between the high voltage VDDH2_L and a low voltage VDDL. It should be noted that the bodies of the first protection transistor pair (i.e., M2, M3) can be coupled to the high-voltage terminal and/or the bodies of the second protection transistor pair (i.e., M4, M5) can be coupled to a low-voltage terminal as illustrated with the dotted lines in FIG. 4, if necessary; and this can prevent a leakage current or an overvoltage and can reduce the consumption of circuit area. In addition, in an alternative embodiment, the body and the source of each transistor of the first protection transistor pair (i.e., M2, M3) can be coupled together and/or the body and the source of each transistor of the second protection transistor pair (i.e., M4, M5) can be coupled together to prevent a leakage current or an overvoltage, but the present invention is not limited thereto.

In regard to the embodiment of FIG. 4, the input circuit 430 includes an input transistor pair (i.e., "M6, M7" in FIG. 4). The input transistor pair is coupled between the second protection transistor pair (i.e., M4, M5) and the low-voltage terminal and configured to be selectively turned on according to a pair of input signals INB, INBB. In the operating mode, the voltage at the low-voltage terminal is the low voltage VDDL; the pair of input signals includes a first input signal INB and a second input signal INBB; the voltage of each of the first input signal INB and the second input signal INBB falls within an input voltage range; and the input voltage range is between the medium voltage VDDH1 and the low voltage VDDL. It should be noted that the bodies of the input transistor pair (i.e., M6, M7) can be coupled to the low-voltage terminal as illustrated with the dotted lines in FIG. 4 to prevent a leakage current or an overvoltage, but the present invention is not limited thereto.

Figure 5A:
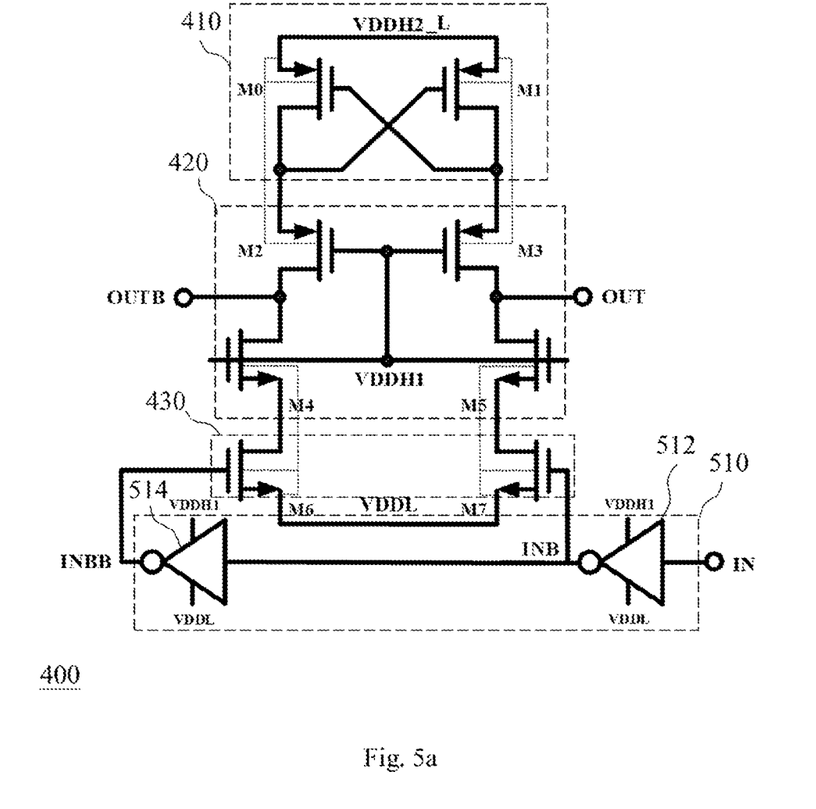
FIG. 5a shows yet another embodiment of the level shifter of the present disclosure.
Figure 5B:
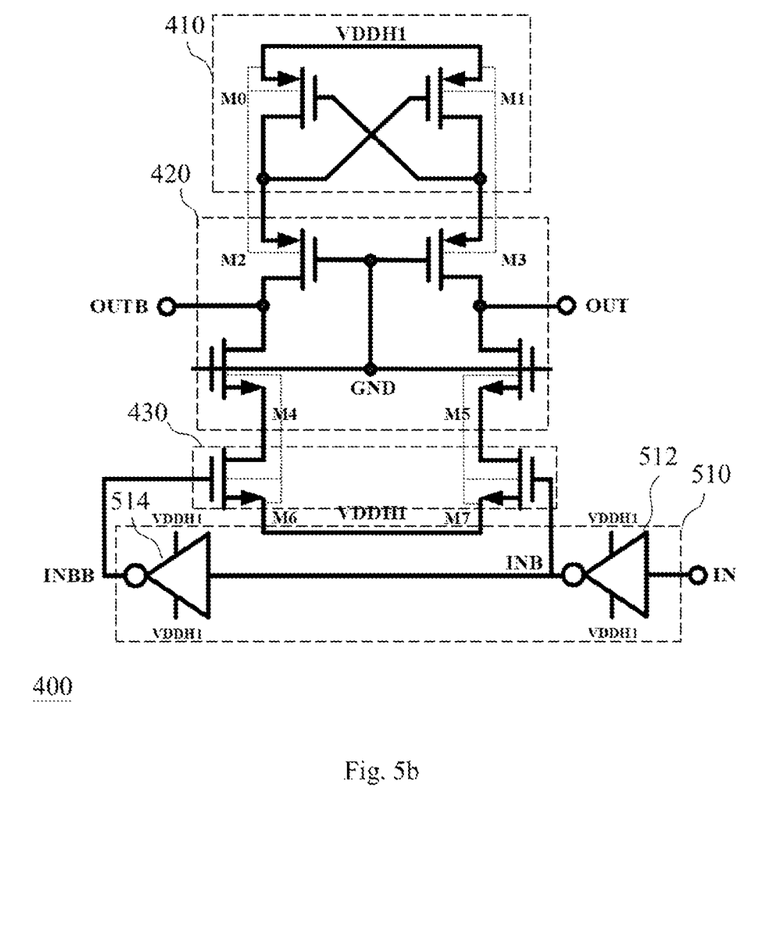
FIG. 5b shows the level shifter of FIG. 5a operating in a power down mode.

FIG. 5a shows another embodiment of the level shifter of the present disclosure. In comparison with the embodiment of FIG. 4, the input circuit 430 of FIG. 5a cooperates with a buffer circuit 510. The buffer circuit 510 is configured to generate the pair of input signals INB, INBB according to a reception signal IN. In the embodiment of FIG. 5a, the buffer circuit 510 includes a first inverter 512 and a second inverter 514. In the operating mode, each of the first inverter 512 and the second inverter 514 operates in an operating voltage range between the medium voltage VDDH1 and the low voltage VDDL. FIG. 5b shows the level shifter 400 of FIG. 5a operating in a power down mode. As shown in FIG. 5b, in the power down mode, the voltage at the high-voltage terminal is pulled to the medium voltage VDDH1, the voltage at the medium-voltage terminal is pulled to the ground voltage GND, the voltage at the low-voltage terminal is pulled to the medium voltage VDDH1, the voltage of each of the first output signal INB and the second output signal INBB is the medium voltage VDDH1, and both the upper limit and the lower limit of the operating voltage range are the medium voltage VDDH1.

Figure 6:
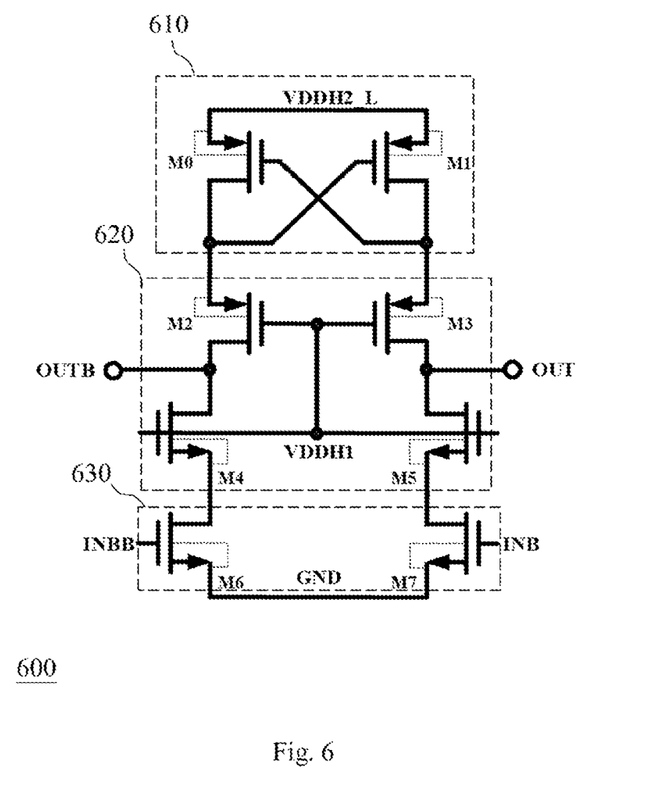
FIG. 6 shows yet another embodiment of the level shifter of the present disclosure.

FIG. 6 shows another embodiment of the level shifter of the present disclosure. The level shifter 600 of FIG. 6 is configured to convert a ground voltage GND into a high voltage VDDH2_L (e.g., 3V). The level shifter 600 includes a latch circuit 610, a protection circuit 620, and an input circuit 630. These circuit are described in the following paragraphs.

In regard to the embodiment of FIG. 6, the latch circuit 610 is coupled between a high-voltage terminal and the protection circuit 620 and includes a transistor pair (i.e., "M0, M1" in FIG. 6), wherein the voltage at the high-voltage terminal is the high voltage VDDH2_L in an operating mode. It should be noted that the bodies of the transistor pair (i.e., M0, M1) can be coupled to the high-voltage terminal as illustrated with the dotted lines in FIG. 6 to prevent a leakage current or an overvoltage, but the present invention is not limited thereto.

In regard to the embodiment of FIG. 6, the protection circuit 620 includes a first protection transistor pair (i.e., "M2, M3" in FIG. 6) and a second protection transistor pair (i.e., "M4, M5" in FIG. 6) and is configured to operate according to the voltage at a medium-voltage terminal. The first protection transistor pair (i.e., M2, M3) is set between the latch circuit 610 and a pair of signal output terminals, and the second protection transistor pair (i.e., M4, M5) is set between the pair of signal output terminals and the input circuit 630. The pair of signal output terminals includes a first output terminal and a second output terminal. In the operating mode, the voltage at the medium-voltage terminal is a medium voltage VDDH1 (e.g., 1.8V); the first output terminal and the second output terminal are used for outputting a first output signal OUT and a second output signal OUTB respectively; the voltage of each of the first output signal and the second output signal falls within an output voltage range; and the output voltage range is between the high voltage VDDH2_L and the ground voltage GND. It should be noted that the body and the source of each transistor of the first protection transistor pair (i.e., M2, M3) can be coupled together and/or the body and the source of each transistor of the second protection transistor pair (i.e., M4, M5) can be coupled together as illustrated with the dotted lines in FIG. 6 to prevent a leakage current or an overvoltage, but the present invention is not limited thereto.

In regard to the embodiment of FIG. 6, the input circuit 630 includes an input transistor pair (i.e., "M6, M7" in FIG. 6). The input transistor pair is coupled between the second protection transistor pair (i.e., M4, M5) and a low-voltage terminal and configured to be selectively turned on according to a pair of input signals INB, INBB. In the operating mode, the voltage at the low-voltage terminal is the ground voltage GND; the pair of input signals includes a first input signal INB and a second input signal INBB; the voltage of each of the first input signal INB and the second input signal INBB falls within an input voltage range; and the input voltage range is between the medium voltage VDDH1 and the ground voltage GND. It should be noted that the bodies of the input transistor pair (i.e., M6, M7) can be coupled to the low-voltage terminal as illustrated with the dotted lines in FIG. 6 to prevent a leakage current or an overvoltage, but the present invention is not limited thereto.

Figure 7A:
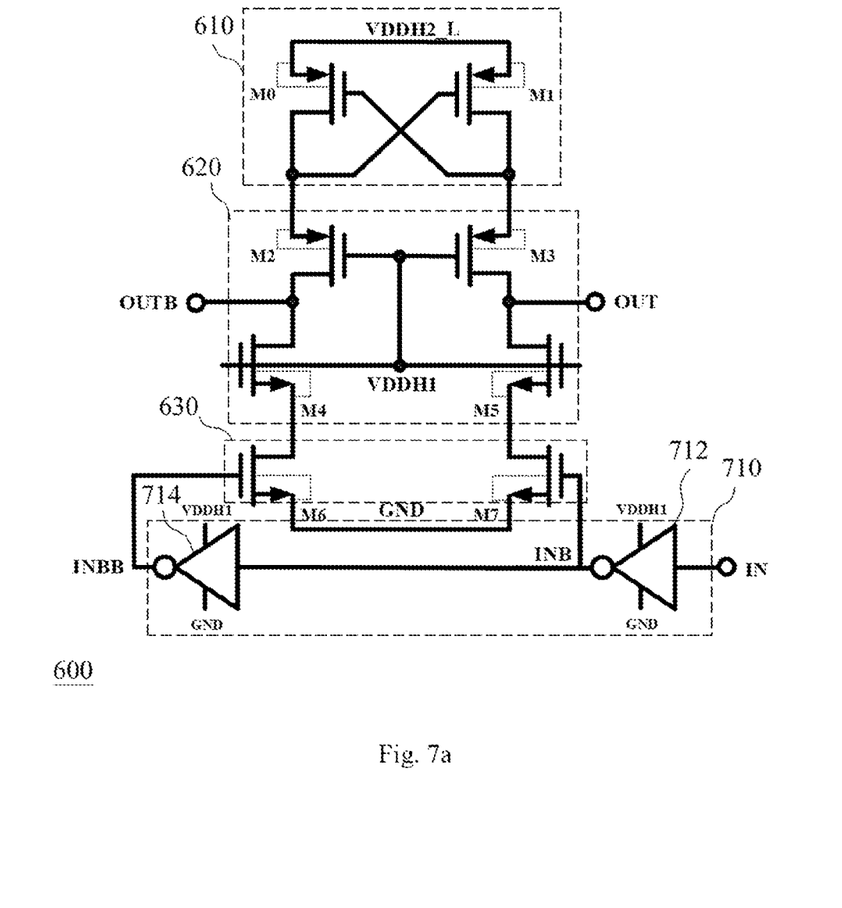
FIG. 7a shows yet another embodiment of the level shifter of the present disclosure.
Figure 7B:
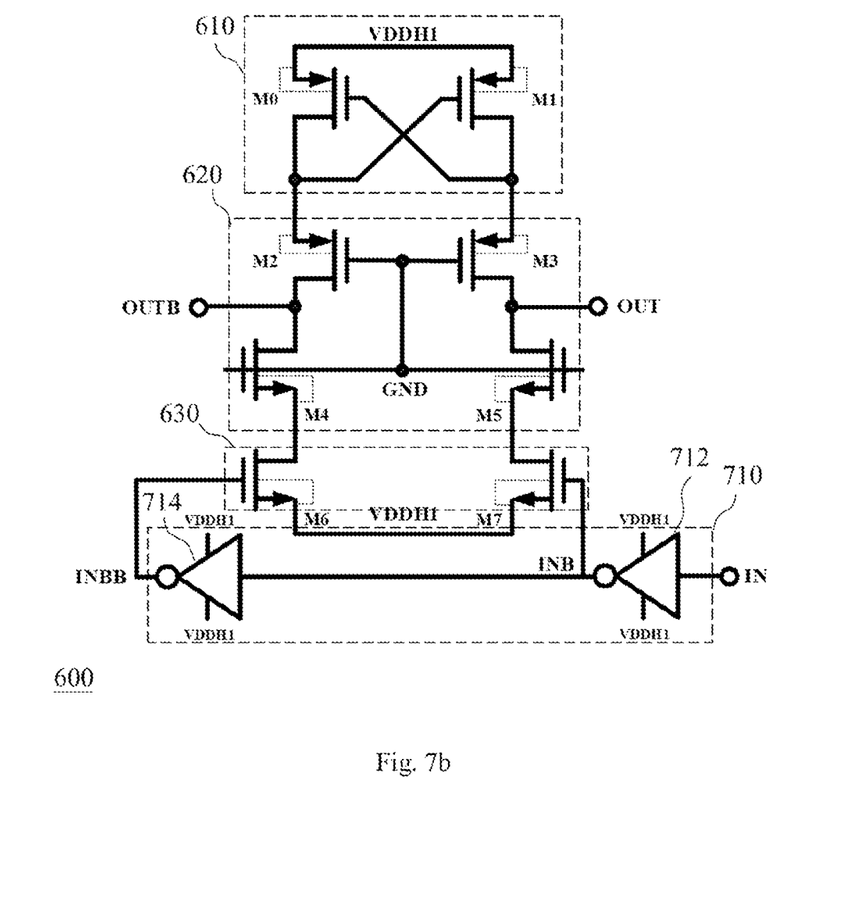
FIG. 7b shows the level shifter of FIG. 7a operating in a power down mode.

FIG. 7a shows another embodiment of the level shifter of the present disclosure. In comparison with the embodiment of FIG. 6, the input circuit 630 of FIG. 7a cooperates with a buffer circuit 710. The buffer circuit 710 is configured to generate the pair of input signals INB, INBB according to a reception signal IN. In the embodiment of FIG. 7a, the buffer circuit 710 includes a first inverter 712 and a second inverter 714. In the operating mode, each of the first inverter 712 and the second inverter 714 operates in an operating voltage range between the medium voltage VDDH1 and the ground voltage GND. FIG. 7b shows the level shifter 600 of FIG. 7a operating in a power down mode. As shown in FIG. 7b, in the power down mode, the voltage at the high-voltage terminal is pulled to the medium voltage VDDH1, the voltage at the medium-voltage terminal is pulled to the ground voltage GND, the voltage at the low-voltage terminal is pulled to the medium voltage VDDH1, the voltage of each of the first output signal INB and the second output signal INBB is the medium voltage VDDH1, and both the upper limit and the lower limit of the operating voltage range are the medium voltage VDDH1.

It should be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the level shifter of the present disclosure is capable of achieving a level shift by a wide margin. The margin of the level shift can be higher than the withstand voltage of at least one transistor of the level shifter.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A level shifter comprising:
   a latch circuit coupled between a high-voltage terminal and a pair of signal output terminals, wherein a voltage at the high-voltage terminal is a high voltage, the pair of signal output terminals includes a first output terminal and a second output terminal, the first output terminal and the second output terminal are used for outputting a first output signal and a second output signal respectively, a voltage of each of the first output signal and the second output signal falls within an output voltage range, and the output voltage range is between the high voltage and a medium voltage;
   a clamping circuit coupled between the pair of signal output terminals and a medium-voltage terminal, and configured to selectively couple the pair of signal output terminals with the medium-voltage terminal according to the first output signal and the second output signal so as to limit a lower limit of the output voltage range to the medium voltage, wherein a voltage at the medium-voltage terminal is the medium voltage;
   a protection circuit including a first protection transistor pair and a second protection transistor pair and configured to operate according to the medium voltage, wherein the first protection transistor pair is set between the pair of signal output terminals and the second protection transistor pair; and
   an input circuit includes: an input transistor pair coupled between the second protection transistor pair and a low-voltage terminal and configured to operate according to a pair of input signals, wherein the second protection transistor pair is coupled between the first protection transistor pair and the input transistor pair, a voltage at the low-voltage terminal is a low voltage, the pair of input signals includes a first input signal and a second input signal, a voltage of each of the first input signal and the second input signal falls within an input voltage range, and the input voltage range is between the medium voltage and the low voltage.

2. The level shifter of claim 1, wherein the level shifter includes transistors, and a withstand voltage of each of the transistors is lower than an upper limit of the output voltage range.

3. The level shifter of claim 1, wherein the input circuit further includes a buffer circuit; the buffer circuit includes a first inverter and a second inverter; the first inverter is configured to generate a first inverted signal as the first input signal according to a reception signal; the second inverter is configured to generate a second inverted signal as the second input signal according to the first inverted signal; each of the first inverter and the second inverter operates in an operating voltage range; and the operating voltage range is between the medium voltage and the low voltage.

4. The level shifter of claim 1, wherein the clamping circuit includes a first transistor and a second transistor; the first transistor is coupled between the second output terminal and the medium-voltage terminal, and configured to be turned on or turned off according to the first output signal; and the second transistor is coupled between the first output terminal and the medium-voltage terminal, and configured to be turned on or turned off according to the second output signal.

5. The level shifter of claim 4, wherein a body of the first transistor is coupled to the medium-voltage terminal, and a body of the second transistor is coupled to the medium-voltage terminal.

6. The level shifter of claim 1, wherein a transistor type of the first protection transistor pair is a first type, a transistor type of the second transistor pair is a second type, and the first type is different from the second type.

* * * * *